(12) United States Patent
Bovington et al.

(10) Patent No.: US 10,826,272 B2
(45) Date of Patent: Nov. 3, 2020

(54) SINGLE-PASS RING-MODULATED LASER

(71) Applicant: Axalume, Inc., Cayenne Creek Rd., CA (US)

(72) Inventors: Jock Bovington, La Mesa, CA (US); Xuezhe Zheng, San Diego, CA (US); Saman Saeedi, San Diego, CA (US); Ashok V. Krishnamoorthy, San Diego, CA (US)

(73) Assignee: Axalume, Inc., San Diego, CA (US)

( * ) Notice: Subject to any disclaimer, the term of this patent is extended or adjusted under 35 U.S.C. 154(b) by 166 days.

(21) Appl. No.: 16/039,105

(22) Filed: Jul. 18, 2018

(65) Prior Publication Data

US 2019/0027898 A1    Jan. 24, 2019

Related U.S. Application Data

(60) Provisional application No. 62/534,210, filed on Jul. 19, 2017, provisional application No. 62/534,211, filed on Jul. 19, 2017.

(51) Int. Cl.
*H01S 5/10* (2006.01)
*H01S 5/14* (2006.01)
(Continued)

(52) U.S. Cl.
CPC .......... *H01S 5/1071* (2013.01); *G02B 6/2935* (2013.01); *G02F 1/2257* (2013.01);
(Continued)

(58) Field of Classification Search
CPC ......... H01S 5/1071–1075; H01S 5/142; H01S 5/021; H01S 5/0218; H01S 5/101;
(Continued)

(56) References Cited

U.S. PATENT DOCUMENTS 6,633,593 B2 * 10/2003 Ksendzov ............... H01S 5/141
372/20
7,414,779 B2 * 8/2008 Huber ................ G01B 9/02069
359/333

(Continued)

FOREIGN PATENT DOCUMENTS

WO    WO-2014107537 A1 * 7/2014 ............. H01S 5/026
WO    WO-2014142832 A1 * 9/2014 ........... H01S 5/1071

*Primary Examiner* — Joshua King
(74) *Attorney, Agent, or Firm* — Steven Stupp

(57) ABSTRACT

An optical source may include an optical gain chip that provides an optical signal and that is optically coupled to an SOI chip. The optical gain chip may include a reflective layer. Moreover, the SOI chip may include: a first optical waveguide, a first ring resonator that selectively optically coupled to a second optical waveguide and that performs phase modulation and filtering of the optical signal, the second optical waveguide, an amplitude modulator, and an output port. Note that the reflective layer in the optical gain chip and the amplitude modulator may define an optical cavity. Furthermore, a resonance of the first ring resonator may be aligned with a lasing wavelength, and the resonance of the first ring resonator and a resonance of the amplitude modulator may be offset from each other. Additionally, modulation of the first ring resonator and the amplitude modulator may be in-phase with each other.

20 Claims, 14 Drawing Sheets

(51) Int. Cl.
  *H01S 5/02* (2006.01)
  *H01S 5/065* (2006.01)
  *H01S 5/00* (2006.01)
  *H01S 5/06* (2006.01)
  *H01S 5/028* (2006.01)
  *G02B 6/293* (2006.01)
  *G02F 1/225* (2006.01)

(52) U.S. Cl.
  CPC .............. *H01S 5/021* (2013.01); *H01S 5/065* (2013.01); *H01S 5/142* (2013.01); *G02F 2203/70* (2013.01); *H01S 5/0085* (2013.01); *H01S 5/0287* (2013.01); *H01S 5/0612* (2013.01); *H01S 5/0654* (2013.01); *H01S 5/141* (2013.01)

(58) Field of Classification Search
  CPC ...... H01S 5/1007; H01S 5/065; H01S 5/0653; H01S 5/0654
  See application file for complete search history.

(56) References Cited

U.S. PATENT DOCUMENTS

| | | | | |
|---|---|---|---|---|
| 9,509,119 | B2* | 11/2016 | Chen | H01S 5/0612 |
| 9,577,410 | B2* | 2/2017 | Yamazaki | H01S 5/0287 |
| 9,778,493 | B1* | 10/2017 | Krishnamoorthy | G02F 1/011 |
| 9,780,528 | B1* | 10/2017 | Zheng | H01S 5/125 |
| 9,939,663 | B2* | 4/2018 | Luo | G02F 1/011 |
| 10,120,211 | B2* | 11/2018 | Zheng | G02F 1/025 |
| 10,281,746 | B2* | 5/2019 | Zheng | H01S 5/3013 |
| 2002/0085609 | A1* | 7/2002 | Ksendzov | H01S 5/141 |
| | | | | 372/94 |
| 2005/0058396 | A1* | 3/2005 | Tormen | G02F 1/3132 |
| | | | | 385/39 |
| 2005/0185681 | A1* | 8/2005 | Ilchenko | H03B 17/00 |
| | | | | 372/20 |
| 2008/0232409 | A1* | 9/2008 | Yamazaki | G02B 6/12004 |
| | | | | 372/20 |
| 2009/0122817 | A1* | 5/2009 | Sato | H01S 5/142 |
| | | | | 372/20 |
| 2009/0285251 | A1* | 11/2009 | Yamazaki | G02B 6/12007 |
| | | | | 372/34 |
| 2010/0085991 | A1* | 4/2010 | Okayama | H01S 5/026 |
| | | | | 372/20 |
| 2010/0202776 | A1* | 8/2010 | Kakitsuka | H04B 10/516 |
| | | | | 398/79 |
| 2010/0303469 | A1* | 12/2010 | Barton | G02B 6/125 |
| | | | | 398/184 |
| 2011/0194572 | A1* | 8/2011 | Yamazaki | G02F 1/011 |
| | | | | 372/6 |
| 2013/0016423 | A1* | 1/2013 | Zheng | H01S 5/142 |
| | | | | 359/344 |
| 2014/0002880 | A1* | 1/2014 | Gottwald | H04B 10/548 |
| | | | | 359/263 |
| 2014/0079082 | A1* | 3/2014 | Feng | H01S 5/021 |
| | | | | 372/20 |
| 2014/0226684 | A1* | 8/2014 | Krishnamoorthy | H01S 5/021 |
| | | | | 372/20 |
| 2015/0207291 | A1* | 7/2015 | Rickman | H01S 3/10053 |
| | | | | 372/20 |
| 2015/0215043 | A1* | 7/2015 | Debregeas | H04B 10/61 |
| | | | | 398/79 |
| 2015/0333475 | A1* | 11/2015 | Blumenthal | H04B 10/505 |
| | | | | 372/20 |
| 2016/0204576 | A1* | 7/2016 | Chen | H01S 5/0612 |
| | | | | 372/20 |
| 2016/0204578 | A1* | 7/2016 | Li | H01S 5/1032 |
| | | | | 372/20 |
| 2016/0336718 | A1* | 11/2016 | Takabayashi | H01S 5/1096 |
| 2017/0139237 | A1* | 5/2017 | Luo | G02F 1/011 |
| 2017/0237229 | A1* | 8/2017 | Menezo | G02F 1/025 |
| | | | | 385/3 |
| 2018/0191132 | A1* | 7/2018 | Hu | H01S 5/50 |
| 2018/0366915 | A1* | 12/2018 | Zilkie | G02B 6/29344 |
| 2019/0027899 | A1* | 1/2019 | Krishnamoorthy | G02F 1/2257 |
| 2019/0229494 | A1* | 7/2019 | Idjadi | G02F 1/00 |
| 2019/0341740 | A1* | 11/2019 | Zilkie | H01S 5/06255 |
| 2020/0026105 | A1* | 1/2020 | Hassan | G02F 1/01708 |

* cited by examiner

SINGLE-PASS RING-MODULATED LASER

CROSS REFERENCE TO RELATED APPLICATIONS

This application claims priority under 35 U.S.C. 119(e) to U.S. Provisional Application Ser. No. 62/534,210, entitled "Rapidly Tunable Silicon Modulated Laser," by Ashok V. Krishnamoorthy, Jock Bovington, Xuezhe Zheng and Saman Saeedi, filed on Jul. 19, 2017, and to U.S. Provisional Application Ser. No. 62/534,211, entitled "Single-Pass Ring-Modulated Laser," by Jock Bovington, Xuezhe Zheng, Saman Saeedi and Ashok V. Krishnamoorthy, filed on Jul. 19, 2017, the contents of both of which are herein incorporated by reference.

This application is related to U.S. patent application Ser. No. 16/039,105, entitled "Single-Pass Ring-Modulated Laser," by Jock Bovington, Xuezhe Zheng, Saman Saeedi and Ashok V. Krishnamoorthy, filed on Jul. 18, 2018.

BACKGROUND

Field

The present disclosure relates to techniques for an optical source. More specifically, the present disclosure relates to a ring-modulated laser.

Related Art

Silicon photonics holds the promise of revolutionizing high-performance computing by removing communication bottlenecks. An efficient high-speed optical modulator is an important component in a silicon photonic link. The function of the optical modulator is to convert a high-speed electrical data signal into optical form. The optical modulator typically needs to have high speed, low power consumption, low optical loss, a high ON/OFF extinction ratio (ER) and compact size.

Typically, silicon high-speed optical modulators are based on the free-carrier plasma dispersion effect. Notably, the optical refractive index of silicon reduces with increased densities of electrons and holes (i.e., free carriers). In order to use this effect for data modulation, the carrier densities in an optical waveguide are usually electrically modulated, so that the optical refractive index is modulated, and thus the optical phase of the propagating laser light is modulated. The phase modulation can then be converted into an optical intensity modulation (e.g., ON/OFF switching) by building the phase-modulation optical waveguide into a ring resonator or a Mach-Zehnder interferometer (MZI), as shown respectively in FIGS. 1A and 1B.

Ring-resonator modulators often use strong resonances for modulation. Consequently, they can usually achieve large ER even with weak phase modulation. However, these ring-resonator modulators typically require precise and dynamic tuning in order to align their resonances with the laser wavelength. This tuning can consume a large amount of power and may require the use of large and complicated control circuits. Alternatively, MZI modulators typically do not need precise and dynamic tuning, but they usually need much stronger phase modulation in order to achieve a large ER. Therefore, MZI modulators are often very long, and usually need high modulation voltage and/or power.

SUMMARY

One embodiment of the present disclosure provides an external cavity optical source. This optical source includes an optical gain chip that provides an optical signal and that is optically coupled to a silicon-on-insulator (SOI) chip. The optical gain chip includes a reflective layer at one end of the optical gain chip. Moreover, the SOI chip includes: a first optical waveguide that conveys the optical signal, a first ring resonator that is selectively optically coupled to the first optical waveguides and that performs phase modulation and filtering of the optical signal, a second optical waveguide that is selectively optically coupled to the first ring resonator and that conveys at least a first portion of the optical signal, an amplitude modulator that reflects at least a second portion of the optical signal back into the second optical waveguide and that passes and amplitude modulates at least a third portion of the optical signal, and an output port that provides at least the third portion of the optical signal. Note that the reflective layer in the optical gain chip and the amplitude modulator define an optical cavity. Furthermore, during operation of the optical source, a resonance of the first ring resonator may be aligned with a lasing wavelength of the optical source, and a resonance of the amplitude modulator may be offset from the resonance of the first ring resonator to prevent gain competition. Additionally, during operation, phase modulation by the first ring resonator and amplitude modulation by the amplitude modulator may be in-phase with each other.

Moreover, the optical gain chip may include a reflective semiconductor optical amplifier.

Furthermore, the optical source may include a tuning circuit that thermally or electrically tunes the first ring resonator.

Additionally, the optical source may use push-push/pull-pull modulation of the first ring resonator and the amplitude modulator (with approximately the same modulation magnitudes and with the same alternating signs on the ring resonator and the amplitude modulator), and the lasing wavelength may be approximately midway in the modulation of the first ring resonator.

Note that the amplitude modulator may include a Mach-Zehnder interferometer (MZI) that includes a second ring resonator, a distributed Bragg reflector-micro ring resonator (DBR-MRR), or a photonic crystal.

In some embodiments, during operation of the optical source, the first ring resonator provides dual-pass phase modulation while the amplitude modulator provides single-pass amplitude modulation.

Moreover, the optical source may include one or more monitoring devices optically coupled to an end of the first optical waveguide, an end of the second optical waveguide or both. Measurements performed by the one or more monitoring devices may be used to adjust the resonance of the first ring resonator or the phase modulation of the first ring resonator.

Furthermore, a change in a current-voltage characteristic of the amplitude modulator may be used to monitor alignment of the resonance of the ring resonator and cavity modes of the optical source.

Other embodiments provide an electronic device that includes the optical source.

Other embodiments provide a system that includes the optical source.

Other embodiments provide a method for providing an optical signal, which may be performed by an optical source, such as the optical source.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

An external cavity optical source is described. This optical source may include an optical gain chip that provides an optical signal and that is optically coupled to an SOI chip. The optical gain chip may include a reflective layer at one end of the optical gain chip. Moreover, the SOI chip may include: a first optical waveguide, a first ring resonator that selectively optically coupled to a second optical waveguide and that performs phase modulation and filtering of the optical signal, the second optical waveguide, an amplitude modulator, and an output port. Note that the reflective layer in the optical gain chip and the amplitude modulator may define an optical cavity. Furthermore, a resonance of the first ring resonator may be aligned with a lasing wavelength, and the resonance of the first ring resonator and a resonance of the amplitude modulator may be offset from each other. Additionally, modulation of the first ring resonator and the amplitude modulator may be in-phase with each other.

This optical technique may be used to modulate an optical source, such as an RML or a laser. Notably, by modulating the transmission of the amplitude-modulator mirror output of the optical source, and by using the ring-resonator filter ring to control chirp in the lasing wavelength and to offset the lasing wavelength from the resonance of the amplitude modulator, the optical source may have improved performance, such as an improved figure of merit (e.g., the optical modulation amplitude). Moreover, the optical source may be compact, with low-power and high-speed modulation that is well-aligned to the lasing wavelength, and without requiring excessively large or precise tuning. Therefore, the optical source may provide improved performance for use in applications, such as in optical links that include the optical source, such as silicon-photonic links, optical fibers, etc.

Figure 2A:
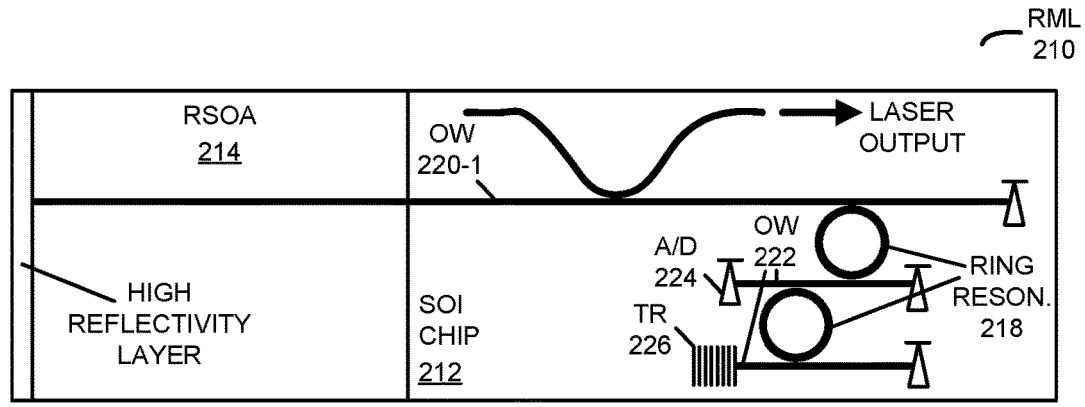
FIG. 2A is a drawing illustrating an example of a ring-modulated laser or a ring-resonator-modulated laser (RML) in accordance with an embodiment of the present disclosure.
Figure 2B:
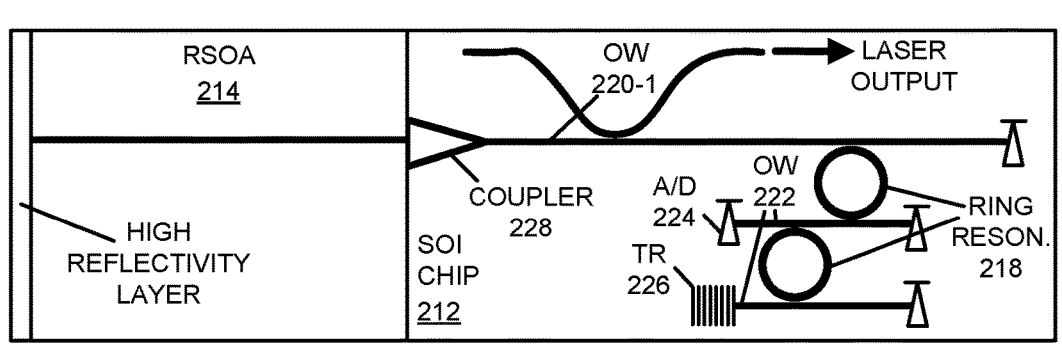
FIG. 2B is a drawing illustrating an example of an RML in accordance with an embodiment of the present disclosure.
Figure 2C:
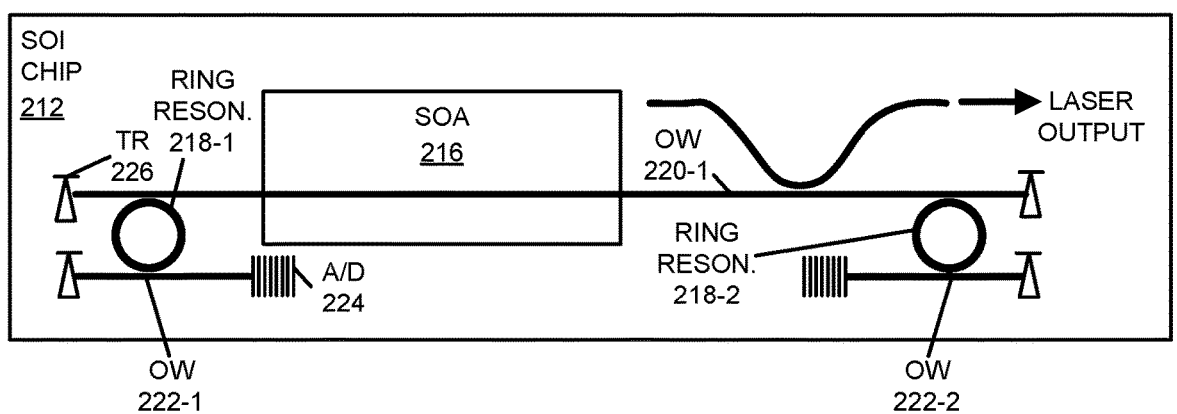
FIG. 2C is a drawing illustrating an example of an RML in accordance with an embodiment of the present disclosure.

We now describe embodiments of an optical technique. FIGS. 2A-2C present drawings illustrating examples of RMLs 210, 230 and 240 on silicon chip 212 (such as a silicon-on-insulator or SOI chip). These RMLs integrate dual ring-resonator 218 modulators into a laser cavity as a mirror. The resonances of the two ring resonators 218 may be push-pull modulated (with the same modulation magnitudes and alternating and opposite signs on ring resonators 218), and the lasing wavelength may be approximately midway between the resonance wavelengths), so that the overall reflection peak wavelength stays unchanged while the overall reflectivity is modulated, and thus the output laser power is modulated. A lasing wavelength may be determined by the ring-resonator-modulator resonance. Consequently, there may not be a need to tune the ring resonance to the laser wavelength. While this provides modulation, because the reflectivity changed, the overall bandwidth may be limited not only by the modulator bandwidth but also by the photon lifetime of the overall laser cavity. Consequently, the modulation bandwidth may be degraded compared to an external ring-resonator modulator.

In FIGS. 2A-2C, note that a semiconductor optical amplifier (SOA) 216 may include a III-V or germanium gain material, and a reflective SOA (RSOA) 214 may be a SOA with one side having a high-reflection (HR) coating. Moreover, in FIG. 2A there is edge coupling between RSOA 214 and silicon optical waveguide (OW) 220-1. Furthermore, in FIG. 2B there is flip-chip vertical coupling using coupler 228 between RSOA 214 and the silicon optical waveguide 220-1. Furthermore, in FIG. 2C there is evanescent coupling using flip-chip or wafer bonding between SOA 216 and the silicon optical waveguide 220-1. Note that bus optical waveguides 222 of the two ring resonators 218 may be terminated with an absorber/deflector (A/D) 224 and/or a total reflector (TR) 226.

Figure 3:
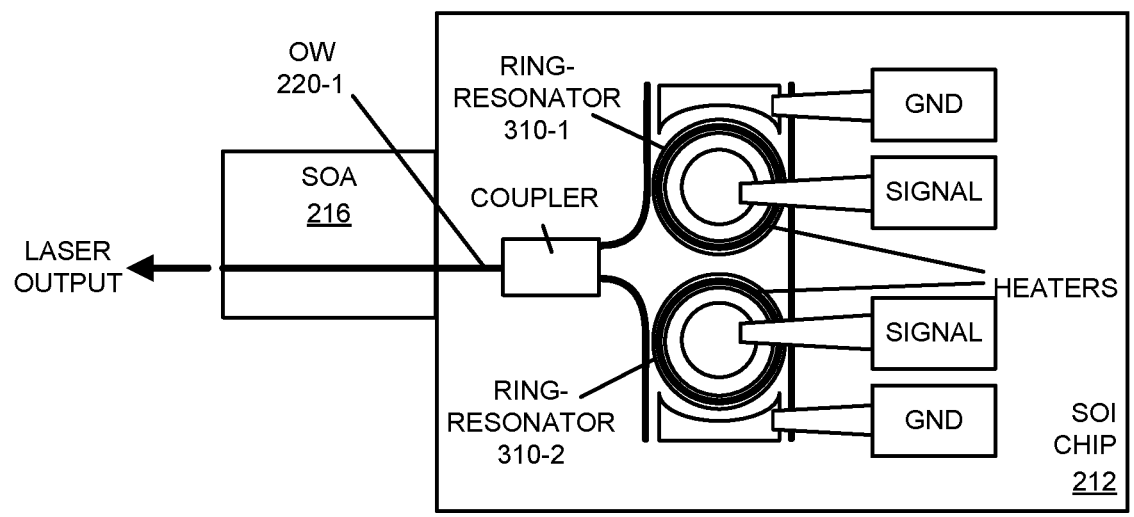
FIG. 3 is a drawing illustrating an example of an RML with dual Vernier rings in accordance with an embodiment of the present disclosure.

Ring resonators 218 may be used as laser reflector/mirrors because of their wavelength selectivity and easy tunability. In some embodiments, double ring resonators with different sizes are used to create a Vernier effect for a large free-spectral range (FSR), such as an FSR greater than 20 nm. This is because the gain medium has wide gain spectrum, and a large FSR helps to prevent unstable simultaneous multi-wavelength lasing. FIG. 3 presents a drawing illustrating an example of an RML 300 with dual Vernier ring resonators 310 as mirrors. The ring arrangement can also be applied to make an RML.

Figure 4:
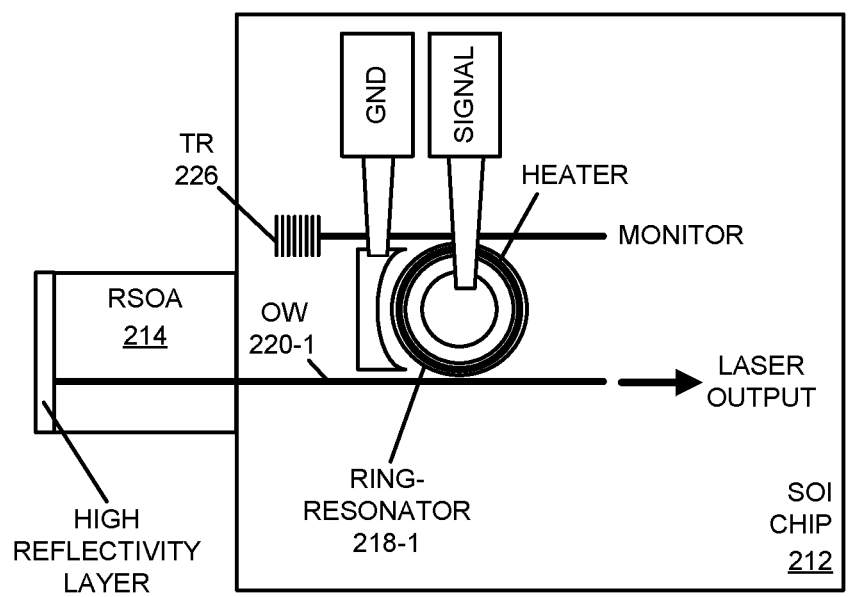
FIG. 4 is a drawing illustrating an example of a single RML in accordance with an embodiment of the present disclosure.

FIG. 4 presents a drawing illustrating an example of a single RML 400. Notably, in this RML the intra-cavity light power variation may be reduced or minimized while the output power is modulated at high speed. However, because a single ring resonator 218-1 is used, there may be a performance trade-off for modulation. This is because the mirror reflectivity often cannot be maintained at a high-level while also providing a strong ER for modulation.

Embodiments of on a dual RML that addresses this challenge are shown in FIGS. 5-9. Notably, FIG. 5A presents a drawing illustrating an example of a dual RML 510 with a directional coupler 512, FIG. 5B presents a drawing illustrating an example of a dual RML 520 with a Y-junction splitter (YJS) 514, and FIG. 5C presents a drawing illustrating an example of a dual RML with flat-top transmission 530 (shown by the dashed line) as a function of wavelength 532 created by offsetting the resonances 516 of ring resonators 218 in RML 510 or 520.

Figure 5A:
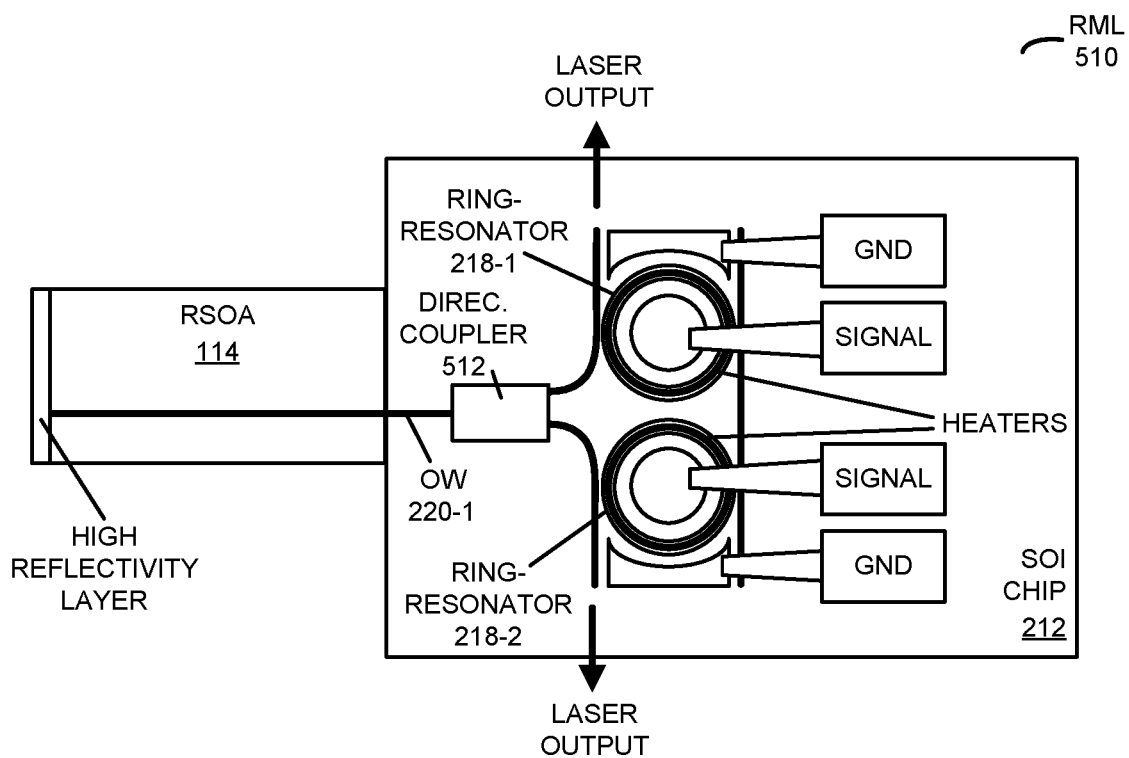
FIG. 5A is a drawing illustrating an example of a dual RML in accordance with an embodiment of the present disclosure.
Figure 5B:
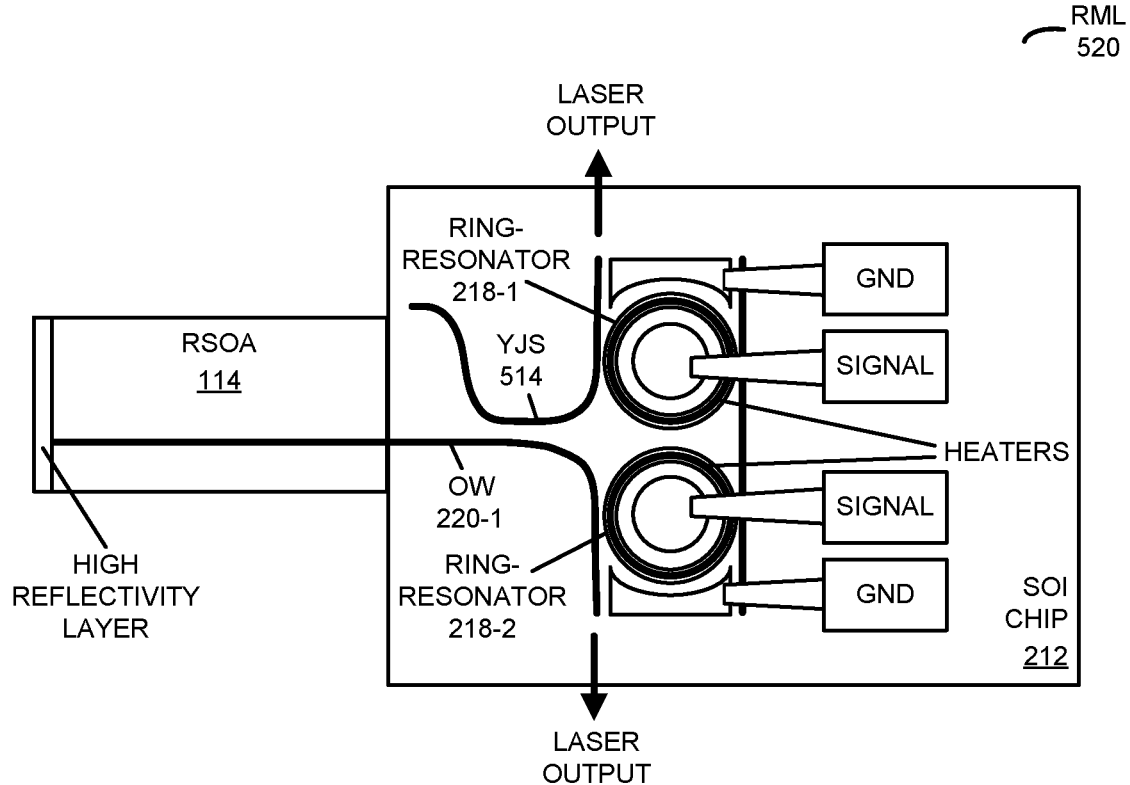
FIG. 5B is a drawing illustrating an example of a dual RML in accordance with an embodiment of the present disclosure.
Figure 5C:
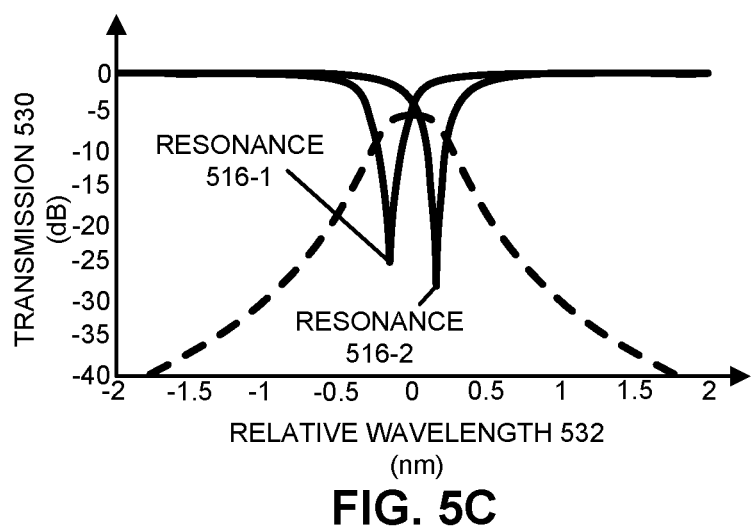
FIG. 5C is a drawing illustrating an example of transmission of a dual RML in accordance with an embodiment of the present disclosure.
Figure 6:
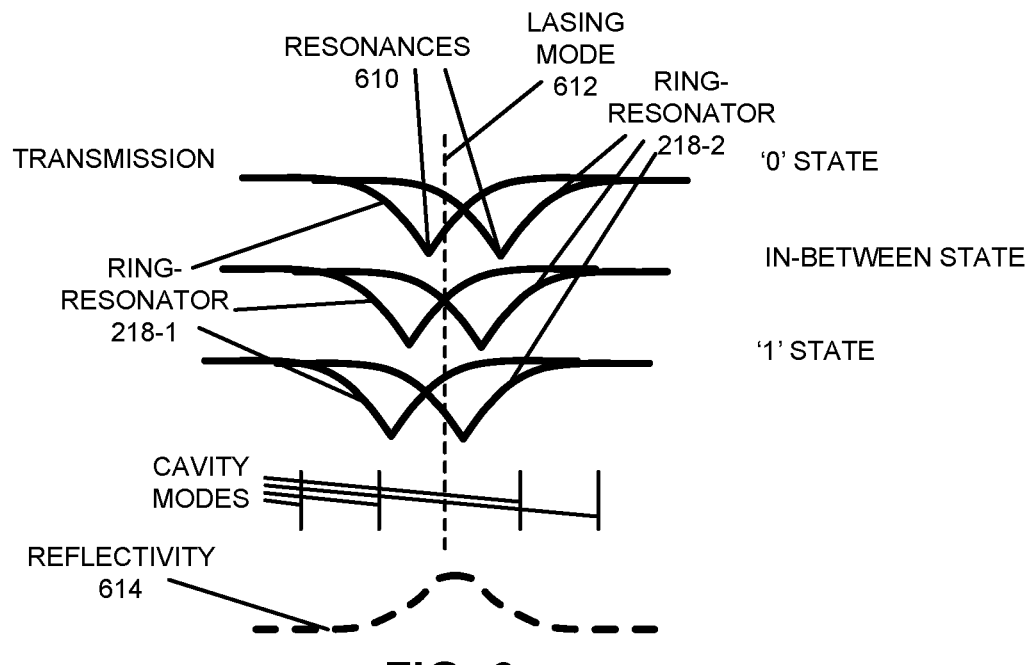
FIG. 6 is a drawing illustrating an example of operation of a dual RML in accordance with an embodiment of the present disclosure.

FIG. 6 presents a drawing illustrating an example of operation of a dual RML, such as one of the dual RMLs in FIGS. 5A-5C. In FIG. 6, the dual RML may be operated using a push-push/pull-pull modulation technique, in which resonances 610 of ring resonators 218 are moved relative to a lasing mode or wavelength 612. For example, the same modulation magnitudes with the same alternating signs may be used on ring resonators 218, and the lasing wavelength 612 may be approximately midway between the resonance wavelengths. The resulting reflectivity 614 of ring resonators 218 may be independent of the modulation Note that each of the embodiments in FIGS. 5A-5C and 7-9 may have the same operating principle.

Figure 7:
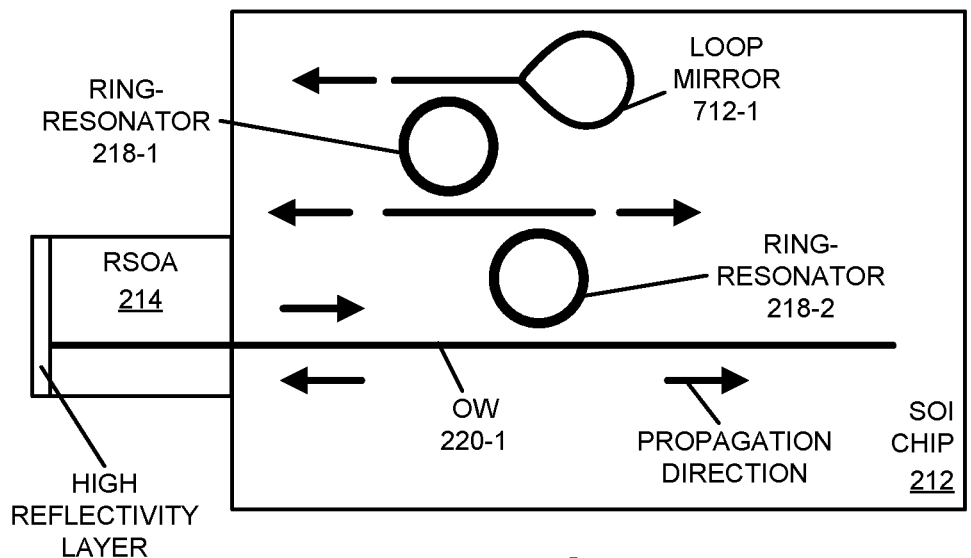
FIG. 7 is a drawing illustrating an example of a dual RML in accordance with an embodiment of the present disclosure.
Figure 8:
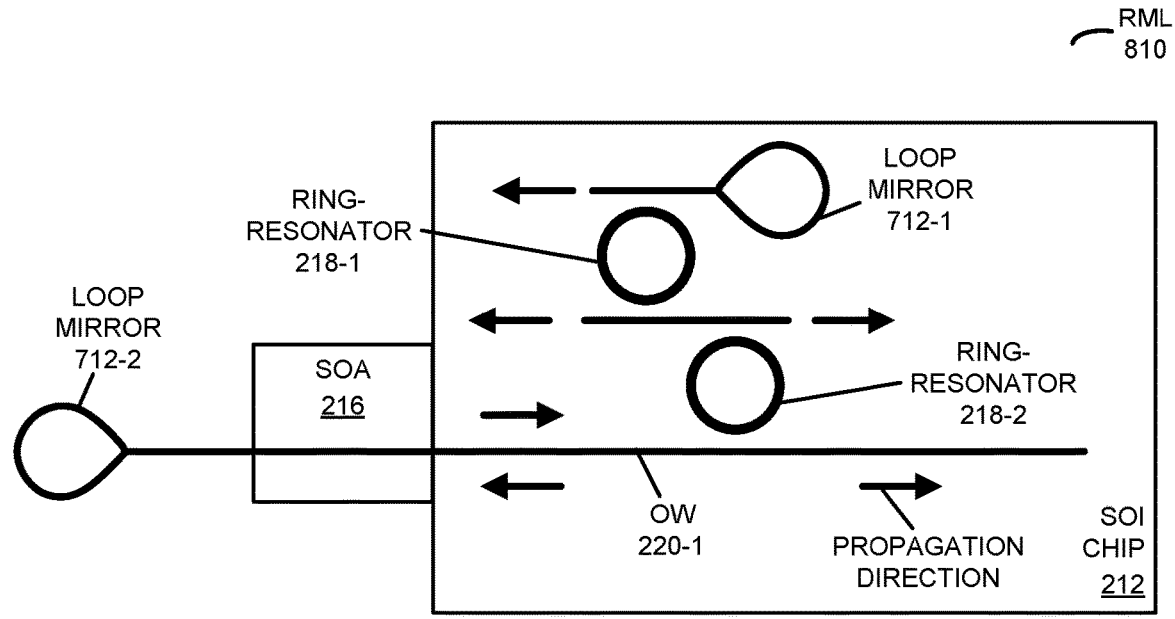
FIG. 8 is a drawing illustrating an example of a dual RML in accordance with an embodiment of the present disclosure.
Figure 9:
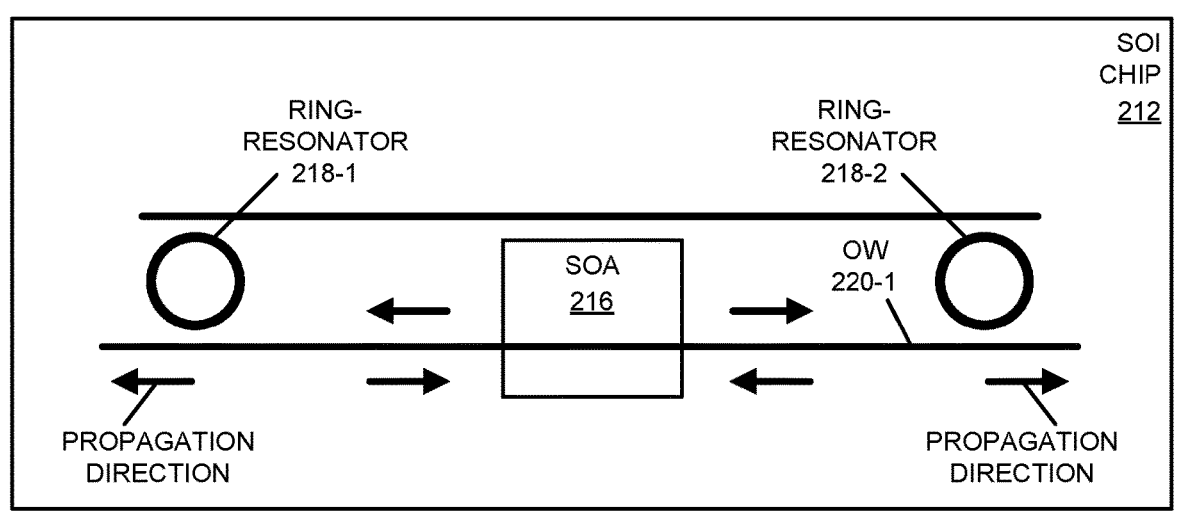
FIG. 9 is a drawing illustrating an example of a dual RML in accordance with an embodiment of the present disclosure.

Examples of various configurations of the dual RML are shown in FIGS. 7-9. Notably, FIG. 7 presents a drawing illustrating an example of a dual RML 710 with a loop mirror 712. FIG. 8 presents a drawing illustrating an example of a dual RML 810 in which the high-reflectivity mirror of RSOA 214 in FIG. 7 is replaced with a loop mirror 712-2. Consequently, in this embodiment SOA 216 may be used with a silicon-based reflector. In alternate embodiments, loop mirror 712-2 is replaced with a distributed Bragg reflector (DBR) mirror or a high-reflectivity facet built in silicon. This configuration may be useful for hybrid epitaxial-III-V-on-silicon bonded devices.

Furthermore, in FIG. 9, which presents a drawing illustrating an example of a dual RML 910, one of the ring-resonator 218 modulator mirrors replaces loop mirror 712-1 of SOA 216 in FIG. 8. This configuration is similar to FIG. 5A and is compatible with hybrid epitaxial III-V-on-silicon bonding by replacing RSOA 214 and the power splitter (such as directional coupler 512) with an in-line SOA 216. In these embodiments, both of the ring resonators 218 may be critically coupled to the corresponding output optical waveguides 912. Note that in FIGS. 7-9, ring resonators 218 in a given RML may be approximately identical. (In the present disclosure, 'approximately' should be understood to mean within 1, 5, 10 or 25%.)

Note that in FIGS. 5A-9 the RMLs output a data and a data-bar port. In contrast, in some embodiments of an optical source (such as a laser) described below, there may be a single output port.

The disclosed laser in the optical technique (which is sometimes referred to as an 'optical source') uses a couple of basic components. Notably, RSOA 214 may be a heterogeneously integrated configuration with an external high reflectivity mirror (such as DBR mirror) or a coated highly reflective semiconductor face. RSOA 214 may interface with silicon chip 212 (with the external cavity mirror) via a passive optical waveguide. Alternatively, RSOA 214 may interface with silicon chip 212 via an anti-reflection (AR) facet coupled edge-to-edge in plane or vertically.

Figure 10A:
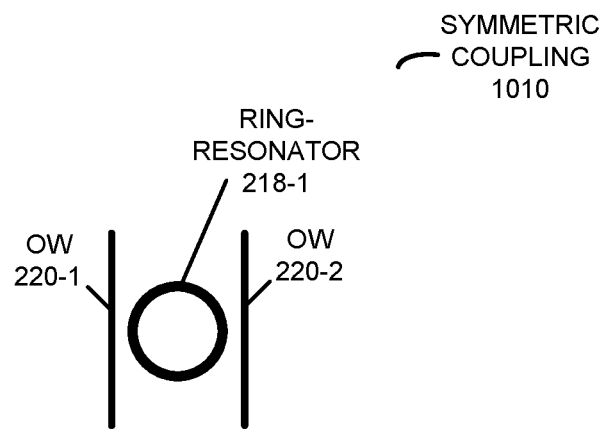
FIG. 10A is a drawing illustrating an example of symmetric, critical coupling between a ring resonator and bus optical waveguides in accordance with an embodiment of the present disclosure.
Figure 10B:
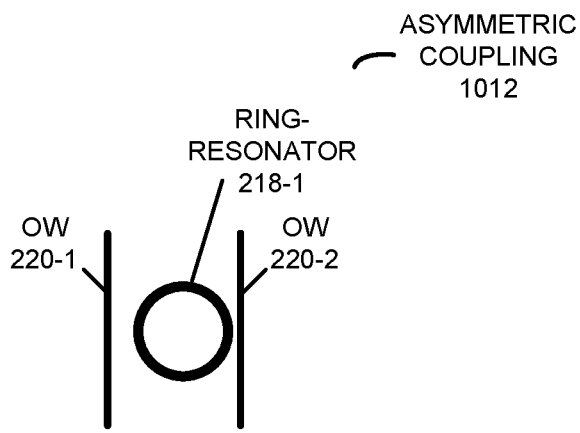
FIG. 10B is a drawing illustrating an example of asymmetric, critical coupling and under coupling between a ring resonator and bus optical waveguides in accordance with an embodiment of the present disclosure.

Moreover, the coupling between a ring resonator and an optical waveguide may be critical or under critical. FIG. 10A presents a drawing illustrating an example of symmetric (critical) coupling 1010 between a ring resonator 218-1 and optical waveguides 220. Alternatively, FIG. 10B presents a drawing illustrating an example of asymmetric, critical coupling 1012 and under coupling between ring resonator 218-1 and optical waveguides 220.

Figure 11:
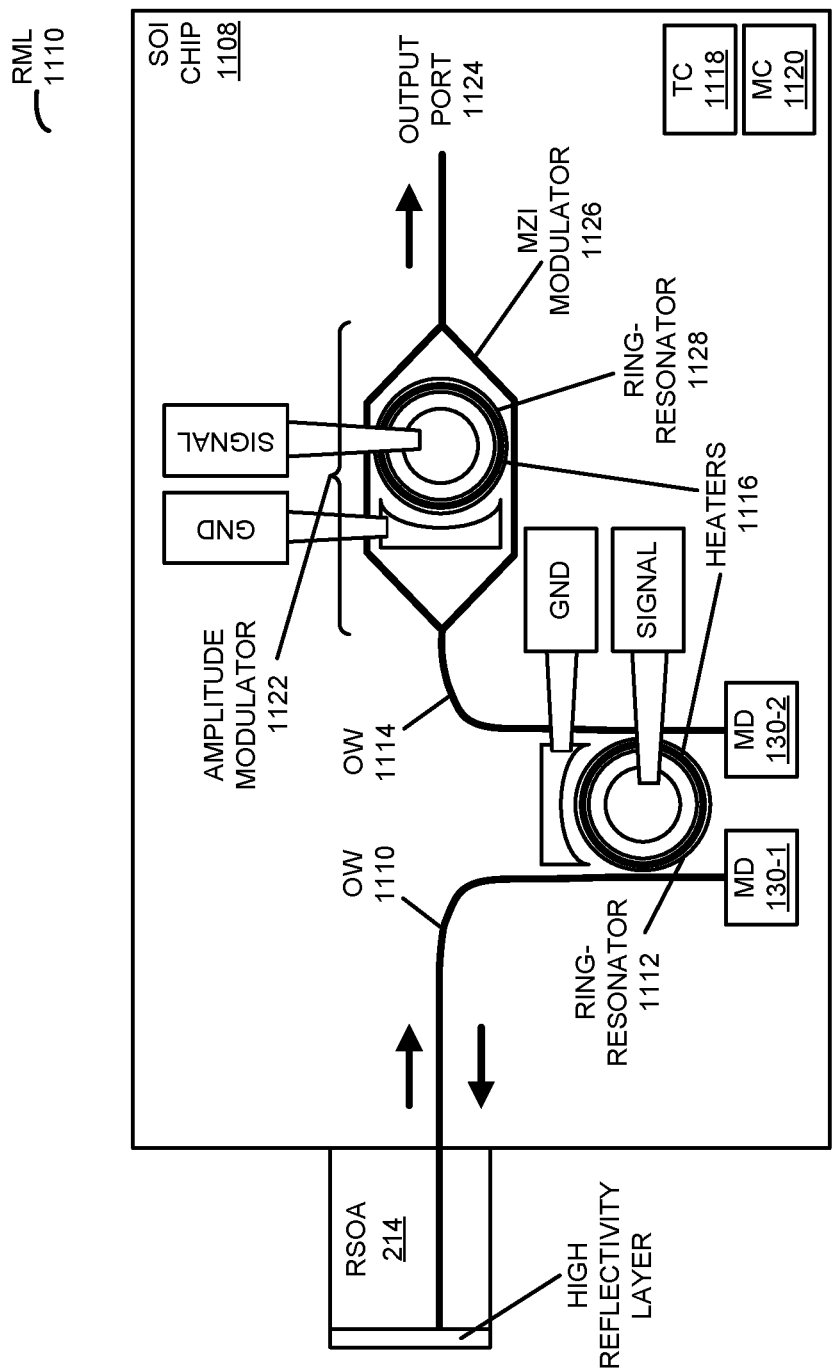
FIG. 11 is a drawing illustrating an example of a dual-pass phase, single-pass amplitude RML in accordance with an embodiment of the present disclosure.

FIG. 11 presents a drawing illustrating a dual-pass phase, single-pass amplitude RML 1100. This RML may be a phase-assisted RML. Notably, in RML 1100, RSOA 214 (and, more generally, an optical gain chip) may provide an optical signal. This optical signal may be conveyed (back and forth) in optical waveguide 1110 (which is sometimes referred to as a 'bus optical waveguide'), e.g., in an SOI chip 1108. At least a portion of the optical signal (such as one or more wavelengths) may be selectively optically coupled by ring resonator 1112 to optical waveguide 1114 (which is sometimes referred to as a 'bus optical waveguide'), which may involve symmetric coupling to improve the fabrication tolerance. Optical waveguide 1114 may convey at least the portion of the optical signal through an amplitude modulator 1122 to output port 1124. The amplitude modulator 1122 may include an MZI modulator 1126 with ring resonator 1128 (which may be symmetrically coupled to the optical waveguides in MZI modulator 1126 to improve the fabrication tolerance). Note that ring resonators 1112 and 1128 may be electrically and/or thermally tuned (such as using heaters 1116 and tuning circuit or TC 1118), and modulation signals for ring resonators 1112 and 1128 may be provided by modulation circuit (MC) 1120. In some embodiments, RML 1110 includes monitoring devices (MD) 1130, which may provide measurements (such as phase measurements) that are used by TC 1118 and/or MC 1120 to adjust the tuning and/or the modulation of at least ring resonator 1112. Additionally, note that a photon-induced change in the current-voltage characteristic of amplitude modulator 1122 to monitor alignment of ring-resonator and cavity modes.

In RML 1100, ring resonator 1112 may be a symmetric ring-resonator phase modulator. It may act as an enhanced phase modulator and may shift a lasing wavelength of RML 1100 in a complimentary manner with amplitude modulator 1122. Ring resonator 1128 in RML 1100 may be another symmetric ring-resonator phase modulator that is in a mirror configuration. Note that amplitude modulator 1122 may only passes the optical signal (or laser light) once (hence, a 'single-pass RML'), while the reflected optical signal from amplitude modulator 1122 may propagate back to RSOA 214 (and, thus, may have a second pass through ring resonator 1112, which may improve the control of the lasing mode or wavelength by ring resonator 1112). This combination of a phase modulator and an amplitude modulator synchronously modulating the optical signal may increase or maximize the optical modulation amplitude in RML 1100.

During operation of the dual-pass phase, single-pass amplitude RML 1100, the phase modulation by ring resonator 1112 may be slow and may offset the lasing wavelength from the amplitude (ring-mirror) modulator 1122. This may prevent gain competition between different optical modes in RML 1100. However, as noted previously, ring resonators 1112 and 1128 may act in concert or synchronously to modulate the optical signal to control the phase and chirp of output port 1124.

As noted previously, the optical signal or light in the optical or lasing cavity (between RSOA 214 and amplitude modulator 1122) may experience a single pass through amplitude modulator 1122 on the way to output port 1124 and, in the round trip, may experience two passes through ring resonator 1112 (i.e., the phase modulator). This may result in relatively low total loss in amplitude modulator 1122 (i.e., the modulated mirror element) because the intended operating point of ring resonator 1112 and amplitude modulator 1122 is such that ring resonator 1112 is approximately aligned (such as within 1, 5, 10 or 25%) to the lasing wavelength, which may be a reduced or the lowest loss operating point for the drop configuration shown in FIG. 11. Furthermore, amplitude modulator 1122, which may operate offset from the lasing wavelength in order to provide efficient output, may pass the vast majority of the optical signal or light entering amplitude modulator 1122 only to output port 1124 or back to ring resonator 1112 in reflection. Note that that this operating technique is in contrast to RML 400 in FIG. 4, which, because of the reciprocity of the two passes, increases the non-useful mirror loss when increasing the coupling to the output port.

Figure 1A:
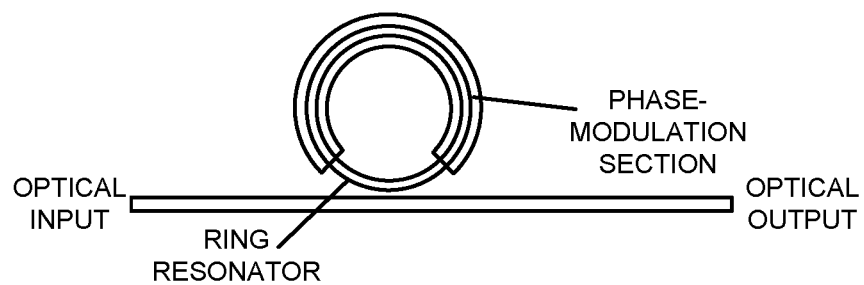
FIG. 1A is a drawing illustrating an existing ring-resonator modulator.
Figure 1B:
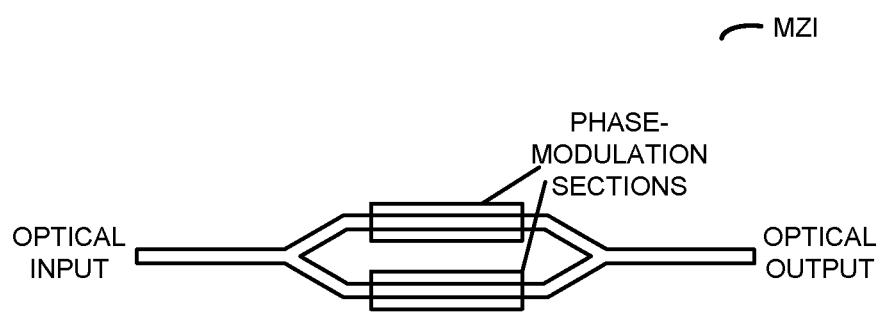
FIG. 1B is a drawing illustrating an existing Mach-Zehnder modulator.
Figure 12:
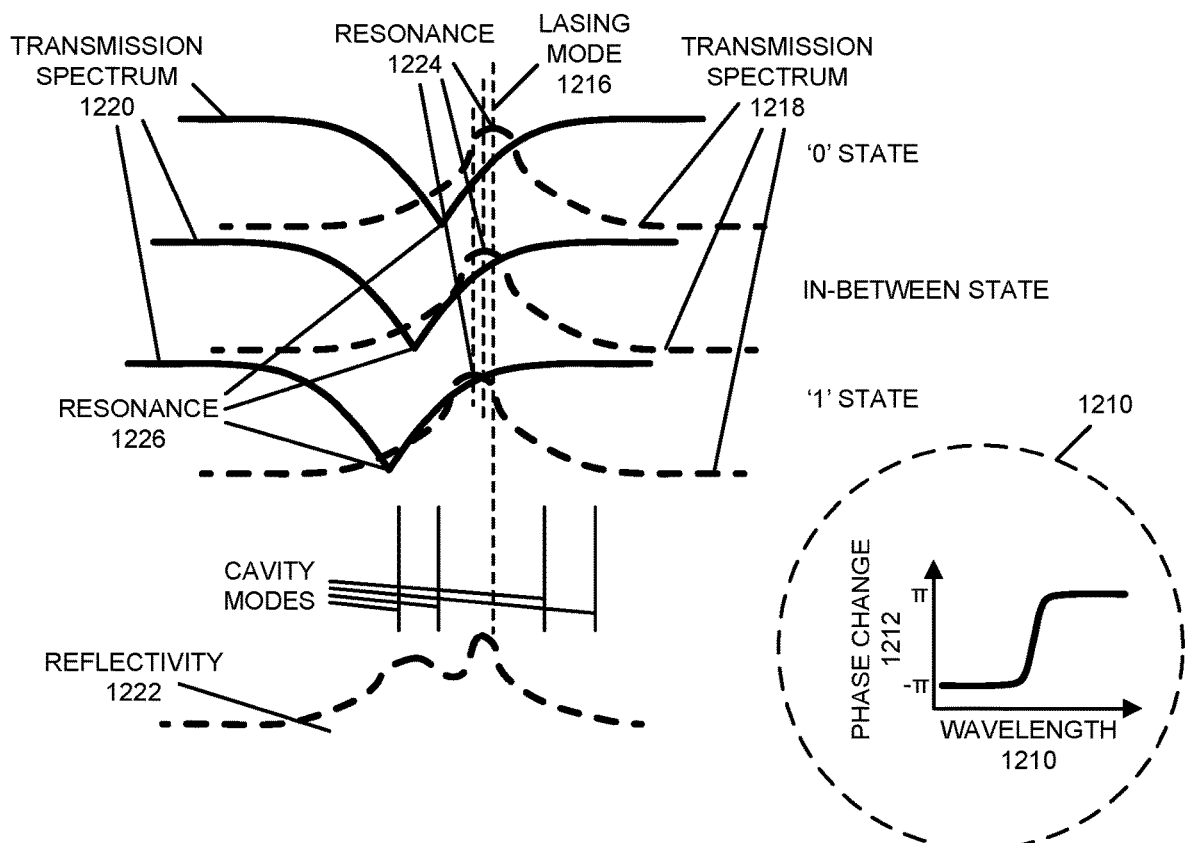
FIG. 12 is a drawing illustrating an example of operation of a dual-pass phase, single-pass amplitude RML in accordance with an embodiment of the present disclosure.

FIG. 12 presents a drawing illustrating operation of a dual-pass phase, single-pass amplitude RML, such as RML 1100 (FIG. 11). Notably, FIG. 12 provides a more detailed explanation of the operating technique for the dual-pass phase, single-pass amplitude RML 1100 (FIG. 1). In order to understand the enhancement provided by the ring-resonator 1112 phase modulator, a qualitative illustration of the phase relationship for the symmetric dual-bus ring-resonator-drop function is shown in inset 1210. There is a steep slope for phase change 1212 as wavelength 1214 (such as a lasing wavelength) passes through a resonance of ring resonator 1112. This enhancement may correspond to a low-loss point for ring-resonator 1112 phase modulator. By placing ring-resonator 1112 phase modulator inside of the lasing cavity, a positive shift in the phase may result in a positive shift in lasing mode 1216 or wavelength. With two passes through ring-resonator 1112 phase modulator, the enhancement can be significant, as illustrated by transmission spectra 1218 of ring resonator 1112 and transmission spectra 1220 of amplitude modulator 1122 spectrum as a function of the modulation state (e.g., '0' or '1'). Another advantage of the two passes through ring resonator 1112 is that the filtering provided by ring resonator 1112 can be used to provide a sharp contrast in reflection spectrum 1222 (as seen at RSOA 214 when the optical signal is returned from amplitude modulator 1122) between resonance 1224 of ring resonator 1112 (which determines a lasing mode 1216) and resonance 1226 of amplitude modulator 1122, which may enable the lasing mode 1216 to be significantly offset from resonance 1226 of amplitude modulator 1122 without initiating a mode hop to an adjacent laser cavity mode. Note that this offset may be desired for efficient output coupling at the cost of operating at a lower ER location. Furthermore, at this operating location, there may still be a phase enhancement, although it is by definition less than it would be on resonance. However, when operating in concert with amplitude modulator 1122, the enhancement provided by the ring-resonator 1112 phase modulator may amplify the poor ER or amplitude modulator 1122, resulting in a high optical modulation amplitude, reasonable ER, and efficient laser operation.

In some embodiments, instead of amplitude modulator 1122 (FIG. 11), an optical source (such as a laser) may include a DBR-micro ring resonator (DBR-MRR) mirror. This DBR-MRR mirror may select a single resonance in a micro ring resonator and may reflect it back to the input port of a bus optical waveguide. In this way, the DBR-MRR may function similar to the symmetric ring-resonator reflector configuration shown in FIGS. 10A and 10B. However, the reflection may be restricted to one of the many resonances of the ring resonator by the mode selection of the DBR period. In some embodiments, electro-optical (EO) modulation of the DBR-MRR is used inside of the laser cavity.

Figure 13:
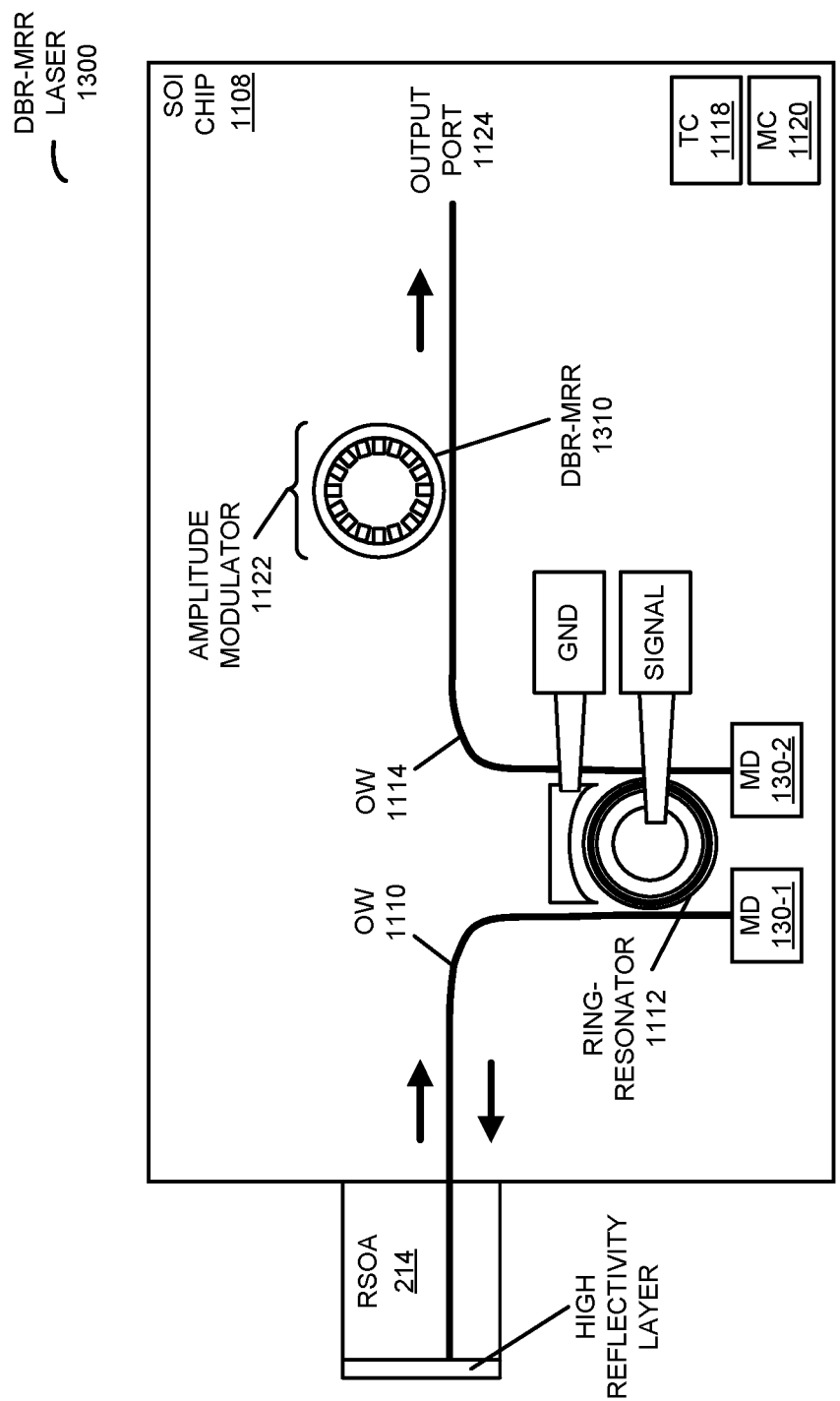
FIG. 13 is a drawing illustrating an example of a distributed Bragg reflector-micro ring resonator (DBR-MRR) laser in accordance with an embodiment of the present disclosure.

FIG. 13 presents a drawing illustrating a DBR-MRR laser 1300 with a ring-resonator 1112 filter to add a slight offset between the lasing wavelength and the resonance of DBR-MRR 1310 to increase or maximize the optical modulation amplitude.

Figure 14:
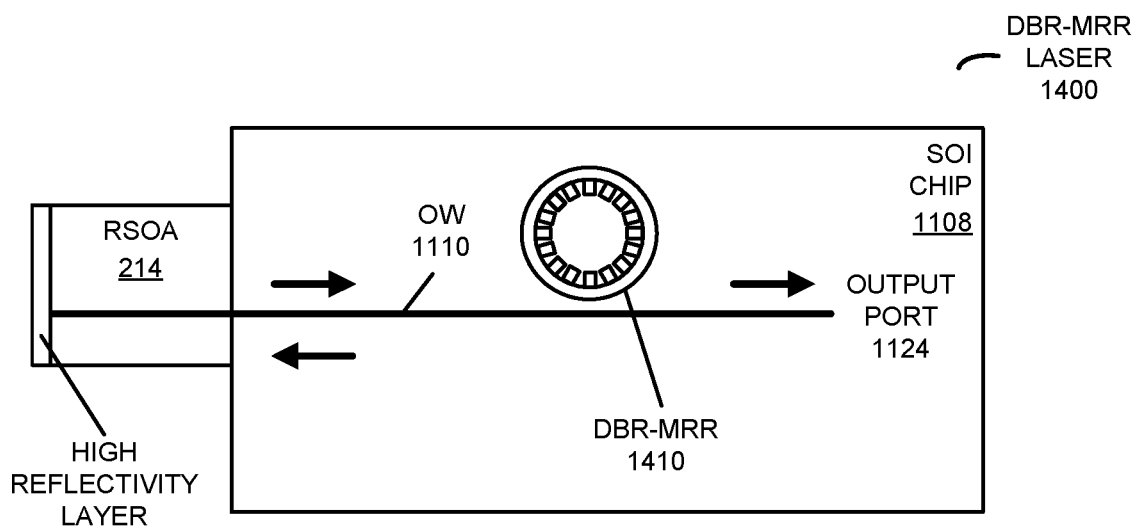
FIG. 14 is a drawing illustrating an example of a DBR-MRR laser in accordance with an embodiment of the present disclosure.

In other embodiments, a similar configuration or architecture may exclude the ring-resonator 1112 filter in the laser cavity. This is shown in FIG. 14, which presents a drawing illustrating a DBR-MRR laser 1400, in which DBR-MRR 1410 may provide the functions or ring resonator 1112 and amplitude modulator 1122 in FIG. 11. In these embodiments, DBR-MRR laser 1400 has a similar operating principle to RML 400 in FIG. 4. However, DBR-MRR 1410 may be a very compact reflective resonator, and therefore it may not have the same capacitance as an equivalent DBR mirror. Furthermore, the resonance may further narrow the bandwidth in order to enable a similar effect as in FIG. 4 where the transmission ER is significantly greater than the reflection ER when DBR-MRR 1410 is modulated.

Figure 15:
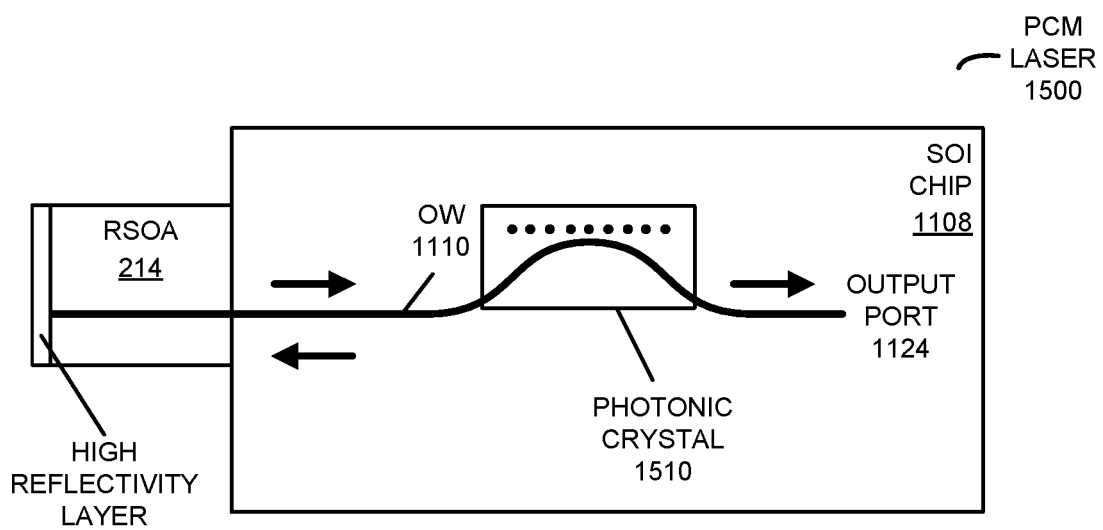
FIG. 15 is a drawing illustrating an example of a photonic crystal-modulated laser in accordance with an embodiment of the present disclosure.

FIG. 15 presents a drawing illustrating a photonic crystal-modulated (PCM) laser 1500 that provides a modulated reflectivity. Notably, in some embodiments PCM laser 1500 includes a photonic crystal 1510 in the optical or lasing cavity similar to DBR-MRR 1410 in FIG. 14. (Thus, photonic crystal 1510 may provide the functions or ring resonator 1112 and amplitude modulator 1122 in FIG. 11.) This lasing cavity can be designed to be more linear than one with a DBR-MRR and, therefore, may be more suitable for platforms with large bending radius, such as thick (e.g., approximately 2-4 μm) silicon platforms. This capability may allow a 1300 nm modulator to be made in a thick silicon platform (e.g., a SOI thickness larger than 1 μm) by combining an appropriate RSOA gain material designed for O-band operation with a phase modulator placed in the photonic-crystal 1510 resonator cavity. This phase modulator may optionally be a Frans-Keldysh-Effect (FKE) phase modulator that may be fabricated using silicon-germanium. Moreover, as noted previously, the phase modulation by photonic crystal 1510 may enable an RML in a thick silicon platform in the O-band (1300 nm range), which may be useful for cloud-computing applications. In some embodiments, photonic crystal 1510 is a DBR with a defect. However, in other embodiments apodization of one or more DBRs is used to enhance the DBR in order to improve the quality factor of PCM laser 1500 and to improve control of the resonance wavelength and coupling, etc. Note that the entire optical waveguide structure and photonic-crystal resonator can be made or fabricated in a photonic crystal. Therefore, photonic crystal 1510 may not simply be a resonator, although it may include the modulation element.

In summary, the disclosed optical technique may be used to modulate a high-speed laser. Notably, the optical technique may use a modulated ring-resonator mirror and a filter in the external cavity section of a laser, such as an RML. By modulating the transmission of the mirror output of the laser, and by using the filter ring resonator to control chirp in the lasing wavelength and to offset the lasing wavelength from the mirror (amplitude-modulator) resonance, a superior figure of merit (such as the optical modulation amplitude) can be obtained. The resulting laser may be compact, with low-power and high-speed modulation that is well-aligned to the lasing wavelength, and without requiring excessively large or precise tuning.

Note that the preceding embodiments may include additional or fewer components. Moreover, positions of one or more components may be changed, two or more components may be combined into a single component and/or a component may be divided into two or more components.

Figure 16:
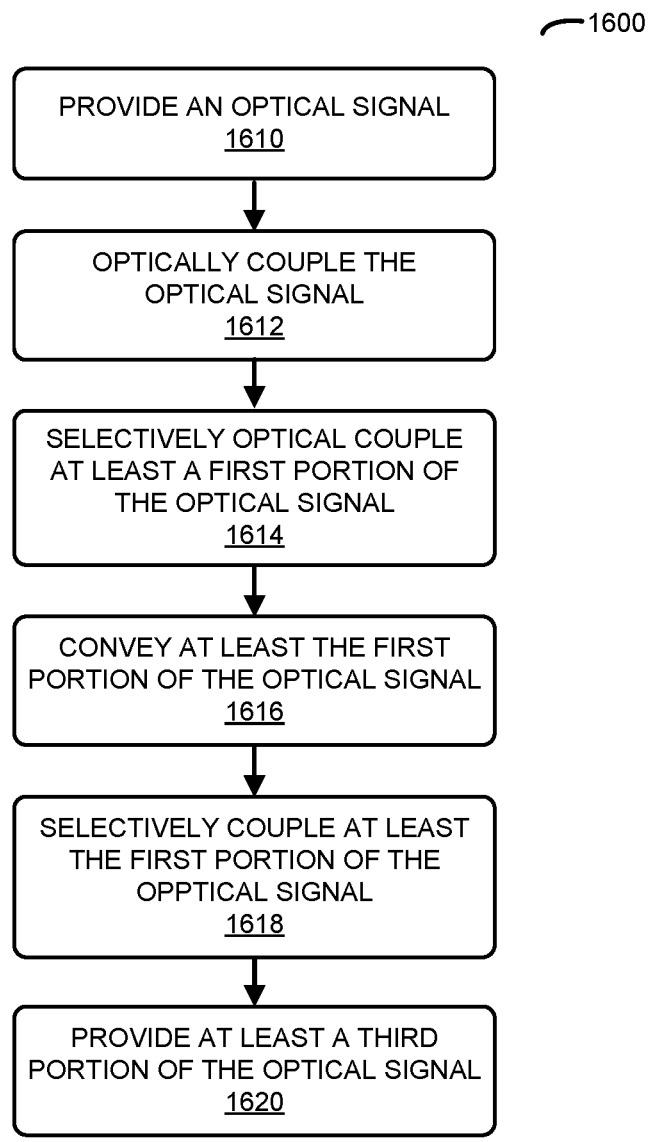
FIG. 16 is a flow diagram illustrating an example of a method for providing an optical signal in accordance with an embodiment of the present disclosure.

We now describe a method. FIG. 16 presents an example of a method 1600 for providing an optical signal, which may be performed by an optical source (such as one of the lasers in the preceding embodiments). During operation, an optical gain chip in the optical source may provide an optical signal (operation 1610). Then, the optical gain chip may optically couple the optical signal (operation 1612) to an SOI chip in the optical source. Moreover, a first optical waveguide in the optical source may convey the optical signal, and a first ring resonator in the optical source may selectively optically couple at least a first portion of the optical signal (operation 1614) to a second optical waveguide in the optical source, where the selective optical coupling may involve phase modulating and filtering the optical signal. Next, the second optical waveguide may convey at least the first portion of the optical signal (operation 1616) and may selectively optically couple at least the first portion of the optical signal (operation 1618) to an amplitude modulator in the optical source, where the selective optical coupling may involve: reflecting at least a second portion of the optical signal back into the second optical waveguide; and passing and amplitude modulating at least a third portion of the optical signal. Furthermore, the amplitude modulator may provide at least the third portion of the optical signal (operation 1620) at an output port. Note that a resonance of the first ring resonator may be aligned with a lasing wavelength of the optical source, and a resonance of the amplitude modulator may be offset from the resonance of the first ring resonator to prevent gain competition. Additionally, phase modulation by the first ring resonator and amplitude modulation by the amplitude modulator may be at least approximately in-phase with each other.

For example, the optical source may include an optical gain chip (such as an RSOA) that provides an optical signal and that is optically coupled to an SOI chip. The optical gain chip may include a reflective layer at one end of the optical gain chip. Moreover, the SOI chip may include: a first optical waveguide that conveys the optical signal, a first ring resonator that is selectively optically coupled to the first optical waveguides and that performs phase modulation and filtering of the optical signal, a second optical waveguide that is selectively optically coupled to the first ring resonator and that conveys at least a first portion of the optical signal, an amplitude modulator that reflects at least a second portion of the optical signal back into the second optical waveguide and that passes and amplitude modulates at least a third portion of the optical signal, and an output port that provides at least the third portion of the optical signal. Note that the reflective layer in the optical gain chip and the amplitude modulator may define an optical cavity. Furthermore, during operation of the optical source, a resonance of the first ring resonator may be aligned with a lasing wavelength of the optical source, and a resonance of the amplitude modulator may be offset from the resonance of the first ring resonator to prevent gain competition. Additionally, during operation, phase modulation by the first ring resonator and amplitude modulation by the amplitude modulator may be in-phase or synchronous with each other.

Moreover, the optical source may include a tuning circuit that thermally or electrically tunes the first ring resonator.

Furthermore, the optical source may use push-push/pull-pull modulation of the first ring resonator and the amplitude modulator (with approximately the same modulation magnitudes and with the same alternating signs on the ring resonator and the amplitude modulator), and the lasing wavelength may be approximately midway in the modulation of the first ring resonator.

Note that the amplitude modulator may include a MZI that includes a second ring resonator, a DBR-MRR, or a photonic crystal.

In some embodiments, during operation of the optical source, the first ring resonator provides dual-pass phase modulation while the amplitude modulator provides single-pass amplitude modulation.

Additionally, the optical source may include one or more monitoring devices (such as phase detectors) optically coupled to an end of the first optical waveguide, an end of the second optical waveguide or both. Measurements performed by the one or more monitoring devices may be used to adjust the resonance of the first ring resonator or the phase modulation of the first ring resonator.

Moreover, a change in a current-voltage characteristic of the amplitude modulator may be used to monitor alignment of the resonance of the ring resonator and cavity modes of the optical source.

In some embodiments of method 1600, there may be additional or fewer operations. Moreover, the order of the operations may be changed, and/or two or more operations may be combined into a single operation.

Figure 17:
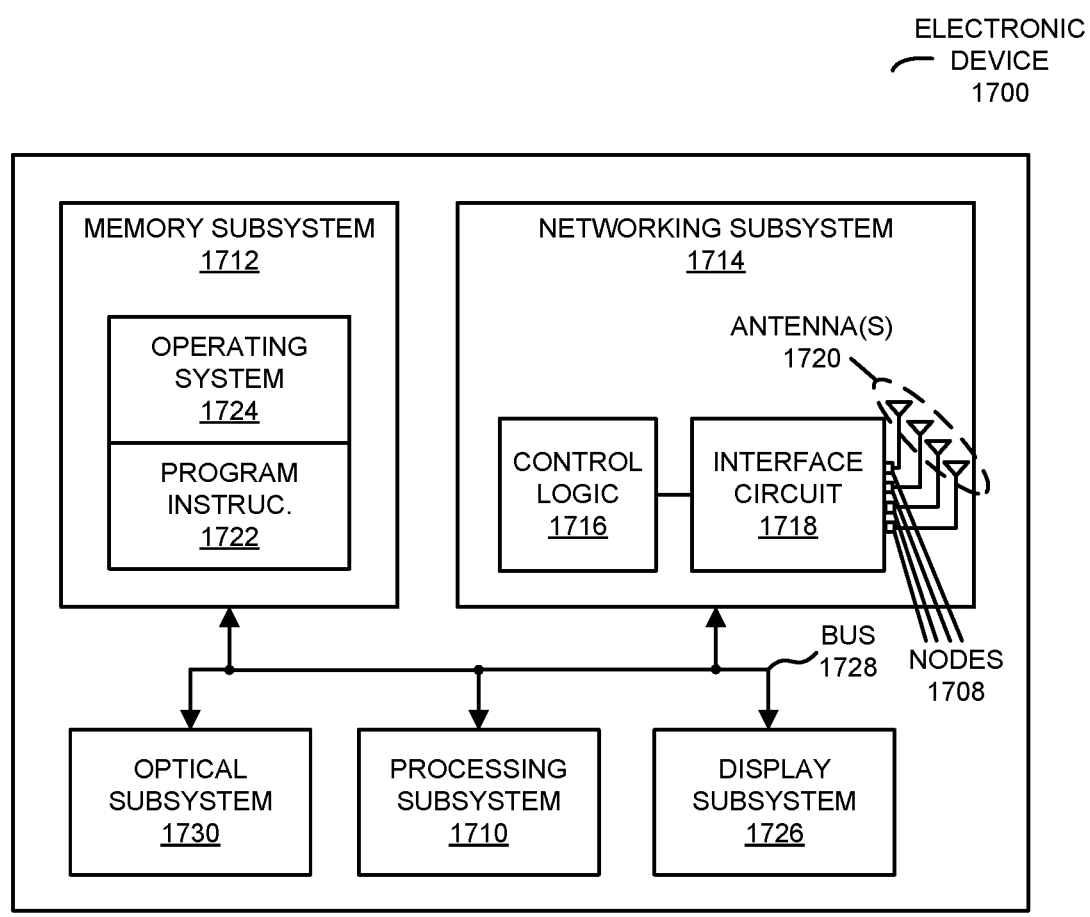
FIG. 17 is a block diagram illustrating an example of an electronic device in accordance with an embodiment of the present disclosure.

We now describe embodiments of an electronic device, which may include a laser (such as an RML). FIG. 17 presents a block diagram illustrating an example of an electronic device 1700 (or one or more electronic devices) in accordance with some embodiments. This electronic device includes processing subsystem 1710, memory subsystem 1712, and networking subsystem 1714. Note that one or more of these subsystems may include at least an instance of one of the previous embodiments of a laser. Alternatively or additionally, electronic device 1700 may optionally include one or more instances of a laser in another component, such as optional optical subsystem 1730.

Processing subsystem 1710 includes one or more devices configured to perform computational operations. For example, processing subsystem 1710 can include one or more: microprocessors, ASICs, microcontrollers, programmable-logic devices, graphics processing units (GPUs) and/ or digital signal processors (DSPs).

Memory subsystem 1712 includes one or more devices for storing data and/or instructions for processing subsystem 1710 and networking subsystem 1714. For example, memory subsystem 1712 can include dynamic random access memory (DRAM), static random access memory (SRAM), and/or other types of memory. In some embodiments, instructions for processing subsystem 1710 in memory subsystem 1712 include: one or more program instructions or sets of instructions (such as program instructions 1722 or operating system 1724), which may be executed by processing subsystem 1710. Note that the one or more computer programs may constitute a computer-program mechanism. Moreover, instructions in the various modules in memory subsystem 1712 may be implemented in: a high-level procedural language, an object-oriented programming language, and/or in an assembly or machine language. Furthermore, the programming language may be compiled or interpreted, e.g., configurable or configured (which may be used interchangeably in this discussion), to be executed by processing subsystem 1710.

In addition, memory subsystem 1712 can include mechanisms (such as a circuit or software) for controlling access to the memory. In some embodiments, memory subsystem 1712 includes a memory hierarchy that comprises one or more caches coupled to a memory in electronic device 1700. In some of these embodiments, one or more of the caches is located in processing subsystem 1710.

In some embodiments, memory subsystem 1712 is coupled to one or more high-capacity mass-storage devices (not shown). For example, memory subsystem 1712 can be coupled to a magnetic or optical drive, a solid-state drive, or another type of mass-storage device. In these embodiments, memory subsystem 1712 can be used by electronic device 1700 as fast-access storage for often-used data, while the mass-storage device is used to store less frequently used data.

Networking subsystem 1714 includes one or more devices configured to couple to and communicate on an optical, a wired and/or wireless network (e.g., to perform network operations), including: control logic 1716, an interface circuit 1718 and one or more optional antennas 1720 (or antenna elements). (While FIG. 17 includes one or more antennas 1720, in some embodiments electronic device 1700 includes one or more nodes, such as nodes 1708, e.g., a pad, which can be coupled to the one or more antennas 1720. Thus, electronic device 1700 may or may not include the one or more antennas 1720.) For example, networking subsystem 1714 can include a Bluetooth networking subsystem, a cellular networking subsystem (e.g., a 3G/4G/5G network such as UMTS, LTE, etc.), a universal serial bus (USB) networking subsystem, a networking subsystem based on the standards described in IEEE 802.11 (e.g., a Wi-Fi® networking system), an Ethernet networking subsystem, and/or another networking subsystem.

Networking subsystem 1714 includes processors, controllers, radios/antennas, sockets/plugs, and/or other devices used for coupling to, communicating on, and handling data and events for each supported networking system. Note that mechanisms used for coupling to, communicating on, and handling data and events on the network for each network system are sometimes collectively referred to as a 'network interface' for the network system. Moreover, in some embodiments a 'network' or a 'connection' between the electronic devices does not yet exist. Therefore, electronic device 1700 may use networking subsystem 1714 for performing simple wireless communication, e.g., transmitting advertising or beacon frames and/or scanning for advertising frames transmitted by other electronic devices.

Within electronic device 1700, processing subsystem 1710, memory subsystem 1712, networking subsystem 1714 and optional optical subsystem 1730 are coupled together using signal lines, links or bus 1728. These connections may include an electrical, optical, and/or electro-optical connection that the subsystems can use to communicate signals, commands and data among one another.

Furthermore, while some components are shown directly connected to one another in FIG. 17, in general coupling can also occur via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used. Although only one bus 1728 (or one or more signal lines) is shown for clarity in FIG. 17, different embodiments can include a different number or configuration of electrical, optical, and/ or electro-optical connections among the subsystems.

In some embodiments, electronic device 1700 includes a display subsystem 1726 for displaying information on a display, which may include a display driver and the display, such as a liquid-crystal display, a multi-touch touchscreen, etc.

Electronic device 1700 and/or an instance of a laser may include or may be included in: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, electronic device 1700 and/or an instance of a laser may include or may be included in, but is not limited to: a desktop computer, a server (such as a multi-socket, multi-rack server), a laptop computer, a communication device or system, an access point, a router, a switch, communication equipment, a controller, test equipment, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a smartwatch, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, a sensor (such as a LIDAR sensor), an automobile or a truck, another electronic device, a laser (such as a hybrid laser and/or another optical component).

Although specific components are used to describe electronic device 1700, in alternative embodiments, different components and/or subsystems may be present in electronic device 1700. For example, electronic device 1700 may include one or more additional processing subsystems, memory subsystems, networking subsystems, display subsystems and/or one or more additional subsystems not shown in FIG. 17 (such as a user-input subsystem). Additionally, one or more of the subsystems may not be present in electronic device 1700. Also, although separate subsystems are shown in FIG. 17, in some embodiments some or all of a given subsystem or component can be moved or integrated into one or more of the other subsystems or component(s) in electronic device 1700. For example, in some embodiments program instructions 1722 are included in operating system 1724 and/or control logic 1716 is included in interface circuit 1718. Thus, while electronic device 1700, as well as the previous embodiments of the laser, are illustrated as having a number of discrete items, these components are intended to be functional descriptions of the various features that may be present rather than structural schematics of the embodiments described herein.

Moreover, the circuits and components in electronic device 1700 may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

An integrated circuit (which is sometimes referred to as a 'communication circuit') may implement some or all of the functionality of electronic device 1700. In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematics of the type detailed above and the corresponding descriptions and encode the data structures on the computer-readable medium. Those of skill in the art of integrated circuit fabrication can use such encoded data to fabricate integrated circuits that include one or more of the circuits described herein.

In some embodiments, the integrated circuit may be implemented using a CMOS technology. Alternatively, the integrated circuit may be implemented using a silicon-on-insulator (SOI) technology or platform. This integrated circuit may include a substrate and a buried-oxide (BOX) layer disposed on the substrate. Moreover, a semiconductor layer may be disposed on BOX layer, where the semiconductor layer, at least in part, includes an optical waveguide. Thus, the substrate may include silicon, the BOX layer may include silicon dioxide, and the semiconductor layer may include silicon. Alternatively, in other embodiments, dielectric optical waveguides are used, i.e. where the starting wafer is a blank silicon wafer with only the lower cladding layer deposited.

However, a wide variety of materials may be used to implement the integrated circuit, the laser and/or the optical waveguide, including: SOI, a semiconductor (e.g., indium phosphide, aluminum gallium arsenide, aluminum gallium nitride arsenide, aluminum gallium arsenide phosphide, a III-V compound semiconductor, etc.), and/or an insulator optical waveguide (e.g., silicon dioxide or silicon nitride). For example, the laser may include a substrate that is an insulator. Consequently, the semiconductor layer and/or the integrated circuit may include: silicon, silicon dioxide, and/ or silicon nitride. Thus, while a silicon was illustrated in the preceding embodiments, the laser may be used or may include with other materials (such as germanium, silicon germanium, another semiconductor, glass and/or plastic), as is known to one of skill in the art. More generally, the laser and/or the integrated circuit may be implemented using a variety of integrated optical waveguide technologies.

In some embodiments, the fundamental or carrier wavelength of an optical signal in the optical waveguide and/or the laser is, e.g., between 1.1-1.7 µm. For example, the optical signal may have a fundamental or a carrier wavelength of 1.3 or 1.55 µm. Moreover, the semiconductor layer may have a thickness that is, e.g., less than 1 µm (such as 0.2-0.5 µm). Furthermore, the semiconductor layer may have a thickness, e.g., of 0.3 µm. Additionally, the BOX layer may have a thickness, e.g., between 0.3 and 3 µm (such as 0.8 µm).

While some of the operations in the preceding embodiments were implemented in hardware or software, in general the operations in the preceding embodiments can be implemented in a wide variety of configurations and architectures, such as by one or more: ASICs, FPGAs, DPSs, GPUs, etc. Therefore, some or all of the operations in the preceding embodiments may be performed in hardware, in software or both. For example, at least some of the operations in the communication technique may be implemented using program instructions 1722, operating system 1724 (such as a driver for interface circuit 1718) or in firmware in interface circuit 1718 or optional optical subsystem 1730. Alternatively or additionally, at least some of the operations in the communication technique may be implemented in a physical layer, such as hardware in interface circuit 1718 or optional optical subsystem 1730. In general, electronic device 1700 may be at one location or may be distributed over multiple, geographically dispersed locations.

Moreover, the preceding embodiments of the laser and/or electronic device 1700 can be used in a wide variety of applications, such as: communications (for example, in a transceiver, an optical source (such as a laser), an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

While the preceding embodiments have been illustrated with particular elements and compounds, a wide variety of materials and compositions (including stoichiometric and non-stoichiometric compositions) may be used, as is known to one of skill in the art. Furthermore, the materials and compounds in the embodiments of the laser and/or optional optical subsystem 1730 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with one or more of the embodiments of the laser and/or optional optical subsystem 1730. Furthermore, a wide variety of optical sources may be integrated with or included in one or more of the embodiments of the laser and/or optional optical subsystem 1730, including many different types of lasers (lasers that are fabricated using materials other than III-V semiconductors) or non-laser optical sources (such as a light-emitting diode).

Moreover, while the preceding discussion included some numerical values, these values are for purposes of illustration and are not intended to be limiting. In other embodiments, different numerical values may be used.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
   an optical gain chip configured to provides an optical signal, wherein the optical gain chip comprises a reflective layer at one end of the optical gain chip; and
   a silicon-on-insulator (SOI) chip optically coupled to the optical gain chip, wherein the SOI chip comprises:
   a first optical waveguide configured to convey the optical signal;
   a first ring resonator selectively optically coupled to the first optical waveguide, wherein the first ring resonator is configured to perform phase modulation and filtering of the optical signal;
   a second optical waveguide selectively optically coupled to the first ring resonator and configured to convey at least a first portion of the optical signal;
   an amplitude modulator, optically coupled to the second optical waveguide, configured to reflect at least a second portion of the optical signal back into the second optical waveguide and to pass and amplitude modulate at least a third portion of the optical signal; and
   an output port, optically coupled to the optical modulator, configured to provide at least the third portion of the optical signal, wherein the reflective layer in the optical gain chip and the amplitude modulator define an optical cavity,
   wherein, during operation of the optical source, a resonance of the first ring resonator is aligned with a lasing wavelength of the optical source, and a resonance of the amplitude modulator is offset from the resonance of the first ring resonator to prevent gain competition; and
   wherein, during operation of the optical source, phase modulation by the first ring resonator and amplitude modulation by the amplitude modulator are in-phase with each other.

2. The optical source of claim 1, wherein the optical gain chip comprises a reflective semiconductor optical amplifier.

3. The optical source of claim 1, wherein the optical source comprises a tuning circuit configured to thermally or electrically tune the first ring resonator.

4. The optical source of claim 1, wherein the optical source is configured to use approximately the same modulation magnitudes and with the same alternating signs on the first ring resonator and the amplitude modulator during the modulation; and
   wherein a lasing wavelength of the optical source is approximately midway in the modulation of the first ring resonator.

5. The optical source of claim 1, wherein the amplitude modulator comprises a Mach-Zehnder interferometer (MZI) that comprises a second ring resonator.

6. The optical source of claim 1, wherein, during operation of the optical source, the first ring resonator is configured to provide dual-pass phase modulation while the amplitude modulator is configured to provide single-pass amplitude modulation.

7. The optical source of claim 1, wherein the optical source comprises one or more monitoring devices optically coupled to an end of the first optical waveguide, an end of the second optical waveguide or both; and
   wherein the optical source is configured to use measurements performed by the one or more monitoring devices to adjust the resonance of the first ring resonator or the phase modulation of the first ring resonator.

8. The optical source of claim 1, wherein the optical source is configured to use a change in a current-voltage characteristic of the amplitude modulator to monitor alignment of the resonance of the ring resonator and cavity modes of the optical source.

9. An electronic device, comprising an optical source, wherein the optical source comprises:
   an optical gain chip configured to provides an optical signal, wherein the optical gain chip comprises a reflective layer at one end of the optical gain chip; and
   a silicon-on-insulator (SOI) chip optically coupled to the optical gain chip, wherein the SOI chip comprises:
   a first optical waveguide configured to convey the optical signal;
   a first ring resonator selectively optically coupled to the first optical waveguide, wherein the first ring resonator is configured to perform phase modulation and filtering of the optical signal;
   a second optical waveguide selectively optically coupled to the first ring resonator and configured to convey at least a first portion of the optical signal;
   an amplitude modulator, optically coupled to the second optical waveguide, configured to reflect at least a second portion of the optical signal back into the second optical waveguide and to pass and amplitude modulate at least a third portion of the optical signal; and
   an output port, optically coupled to the optical modulator, configured to provide at least the third portion of the optical signal, wherein the reflective layer in the optical gain chip and the amplitude modulator define an optical cavity,
   wherein, during operation of the optical source, a resonance of the first ring resonator is aligned with a lasing wavelength of the optical source, and a resonance of the amplitude modulator is offset from the resonance of the first ring resonator to prevent gain competition; and wherein, during operation of the optical source, phase modulation by the first ring resonator and amplitude modulation by the amplitude modulator are in-phase with each other.

10. The electronic device of claim 9, wherein the optical gain chip comprises a reflective semiconductor optical amplifier.

11. The electronic device of claim 9, wherein the optical source comprises a tuning circuit configured to thermally or electrically tune the first ring resonator.

12. The electronic device of claim 9, wherein the optical source is configured to use approximately the same modulation magnitudes and with the same alternating signs on the first ring resonator and the amplitude modulator during the modulation; and
wherein a lasing wavelength of the optical source is approximately midway in the modulation of the first ring resonator.

13. The electronic device of claim 9, wherein the amplitude modulator comprises a Mach-Zehnder interferometer (MZI) that comprises a second ring resonator.

14. The electronic device of claim 9, wherein, during operation of the optical source, the first ring resonator is configured to provide dual-pass phase modulation while the amplitude modulator is configured to provide single-pass amplitude modulation.

15. The electronic device of claim 9, wherein the optical source comprises one or more monitoring devices optically coupled to an end of the first optical waveguide, an end of the second optical waveguide or both; and
wherein the optical source is configured to use measurements performed by the one or more monitoring devices to adjust the resonance of the first ring resonator or the phase modulation of the first ring resonator.

16. The electronic device of claim 9, wherein the optical source is configured to use a change in a current-voltage characteristic of the amplitude modulator to monitor alignment of the resonance of the ring resonator and cavity modes of the optical source.

17. A method for providing an optical signal, comprising: by an optical source:
providing an optical signal using an optical gain chip;
optically coupling the optical signal to a silicon-on-insulator (SOI) chip;
conveying the optical signal in a first optical waveguide;
selectively optically coupling at least a first portion of the optical signal to a second optical waveguide via a first ring resonator, wherein the selective optical coupling involves phase modulating and filtering the optical signal;
conveying at least the first portion of the optical signal in a second optical waveguide;
selectively optically coupling at least the first portion of the optical signal to an amplitude modulator, wherein the selective optical coupling involves:
reflecting at least a second portion of the optical signal back into the second optical waveguide; and
passing and amplitude modulating at least a third portion of the optical signal; and
providing at least the third portion of the optical signal at an output port, wherein a resonance of the first ring resonator is aligned with a lasing wavelength of the optical source, and a resonance of the amplitude modulator is offset from the resonance of the first ring resonator to prevent gain competition, and
wherein phase modulation by the first ring resonator and amplitude modulation by the amplitude modulator are in-phase with each other.

18. The method of claim 17, wherein the phase modulation and the amplitude modulation use approximately the same modulation magnitudes and with the same alternating signs on the first ring resonator and the amplitude modulator; and
wherein a lasing wavelength of the optical source is approximately midway in the modulation of the first ring resonator.

19. The method of claim 17, wherein the amplitude modulator comprises a Mach-Zehnder interferometer (MZI) that comprises a second ring resonator.

20. The method of claim 17, wherein the first ring resonator provides dual-pass phase modulation while the amplitude modulator provides single-pass amplitude modulation.

* * * * *